United States Patent [19]
Genuit

[11] 4,119,838
[45] Oct. 10, 1978

[54] ELECTRONIC SCORE-KEEPER FOR TABLE TENNIS

[76] Inventor: Luther L. Genuit, 6231 Calle Del Paisano, Scottsdale, Ariz. 85251

[21] Appl. No.: 824,560

[22] Filed: Aug. 15, 1977

[51] Int. Cl.² ..................... H03K 21/22; G08B 23/00
[52] U.S. Cl. .......................... 235/92 GA; 235/92 BQ; 235/92 R; 340/323 R
[58] Field of Search ....... 235/92 GA, 92 EA, 92 BQ; 340/323 R; 273/1 ES, 30

[56] References Cited

U.S. PATENT DOCUMENTS

| 2,296,508 | 9/1942 | Eckert | 340/323 |
| 2,455,422 | 12/1948 | Kucks | 340/323 |

Primary Examiner—Joseph M. Thesz
Attorney, Agent, or Firm—Warren F. B. Lindsley

[57] ABSTRACT

An electronic score-keeper for table tennis or ping pong having a digital or binary read-out for display of the score and lamps which are energized to indicate responsibility for the serve. Each player presses a button at the side of the table to register his points.

12 Claims, 12 Drawing Figures

| BCD COUNTER | | | | |
|---|---|---|---|---|
| CL | OUTPUT | | | |
| | D | C | B | A |
| 0 | L | L | L | L |
| 1 | L | L | L | H |
| 2 | L | L | H | L |
| 3 | L | L | H | H |
| 4 | L | H | L | L |
| 5 | L | H | L | H |
| 6 | L | H | H | L |
| 7 | L | H | H | H |
| 8 | H | L | L | L |
| 9 | H | L | L | H |

| BIQUINARY | | | | |
|---|---|---|---|---|
| CL | OUTPUT | | | |
| | A | D | C | B |
| 0 | L | L | L | L |
| 1 | L | L | L | H |
| 2 | L | L | H | L |
| 3 | L | L | H | H |
| 4 | L | H | L | L |
| 5 | H | L | L | L |
| 6 | H | L | L | H |
| 7 | H | L | H | L |
| 8 | H | L | H | H |
| 9 | H | H | L | L |

| BCD TO SEVEN SEGMENT DECODER | | | | | | | | | | | |
|---|---|---|---|---|---|---|---|---|---|---|---|
| N | INPUT | | | | OUTPUT | | | | | | |
| | D | C | B | A | a | b | c | d | e | f | g |
| 0 | L | L | L | L | L | L | L | L | L | L | H |
| 1 | L | L | L | H | H | L | L | H | H | H | H |
| 2 | L | H | H | L | L | L | H | L | L | H | L |
| 3 | L | L | H | H | L | L | L | L | H | H | L |
| 4 | L | H | L | L | H | L | L | H | H | L | L |
| 5 | H | L | L | L | L | H | L | L | H | L | L |
| 6 | L | H | L | H | H | H | L | L | H | L | L |
| 7 | H | L | H | L | L | L | L | H | H | H | H |
| 8 | H | L | H | H | L | L | L | L | L | L | L |
| 9 | H | H | L | L | L | L | L | H | H | L | L |

ELECTRONIC SCORE-KEEPER FOR TABLE TENNIS

BACKGROUND OF THE INVENTION

There is hardly a game with more to offer as a recreational activity for people of all ages than table tennis, or as it is commonly called, ping pong. The game encourages physical exercise and the development of dexterity and coordination. It is entertaining for players as well as for observers, and the playing equipment is inexpensive and widely available.

Through 1930, 1940 and well into 1950 the game was especially popular. Then, in the usual cyclical course of things, it lost its popularity until in 1970 when it enjoyed such a resurgence in popularity that it was utilized as a means for encouraging friendship and cooperation among otherwise hostile countries. International tournaments were organized, with teams participating from all over the world.

Unfortunately, however, the recent craze and excitement over electronic games has distracted a large body of the young people who had taken up the sport of table tennis, and these young people are now spinning dials and knobs, playing simulated table tennis and other games in which electronically produced animation is replacing the physical involvement of the original games. Much of the real recreational value is lost in the process, and the relatively high equipment costs for the electronic games are adding financial burdens for those who feel a need to be a part of the action.

One of the drawbacks of table tennis as a purely social pastime and recreational activity is the difficulty of keeping track of the score and remembering each time which player has the serve. This difficulty detracts from the enjoyment of the game and plays a part in discouraging its wider acceptance.

The goal of the present invention is to provide an electronic device for keeping track of the score and indicating the responsibility for serving, while eliminating the major barrier to the complete enjoyment of the game. The invention capitalizes on the current interest in electronics and offers a high potential for success in achieving the desired level of public acceptance for the device and the game of table tennis.

SUMMARY OF THE INVENTION

In accordance with the invention claimed an electronic score-keeper is provided for registering and displaying the scores of both players and indicating which player has the serve.

It is, therefore, one object of this invention to provide an electronic score-keeper for ping pong or table tennis.

Another object of this invention is to provide at all times a visual indication of which player has the serve.

A further object of this invention is to provide at each side of the playing table a button to be depressed by the player as he gains a point, the pressing of the button causing that player's score to be advanced by one point.

A still further object of this invention is to provide one or more digital read-out displays which provide visual indication of the immediate score.

A still further object of this invention is to provide an alternative binary read-out display of the score.

A still further object of this invention is to provide two indicating lamps, each energized indicating which player has the serve.

A still further object of this invention is to provide an electronic score-keeper in a form which utilizes commonly available integrated circuits thereby achieving advantages of economy and compact construction made possible by integrated circuit technology.

A still further object of this invention is to provide an electronic innovation which removes the score-keeping and serving obstacle of the game of table tennis.

Further objects and advantages of the invention will become apparent as the following description proceeds and the features of novelty which characterize the invention will be pointed out with particularity in the claims annexed to and forming a part of this specification.

BRIEF DESCRIPTION OF THE DRAWING

The present invention may be more readily described by reference to the accompanying drawing in which.

DESCRIPTION OF THE PREFERRED EMBODIMENT

Figure 1:
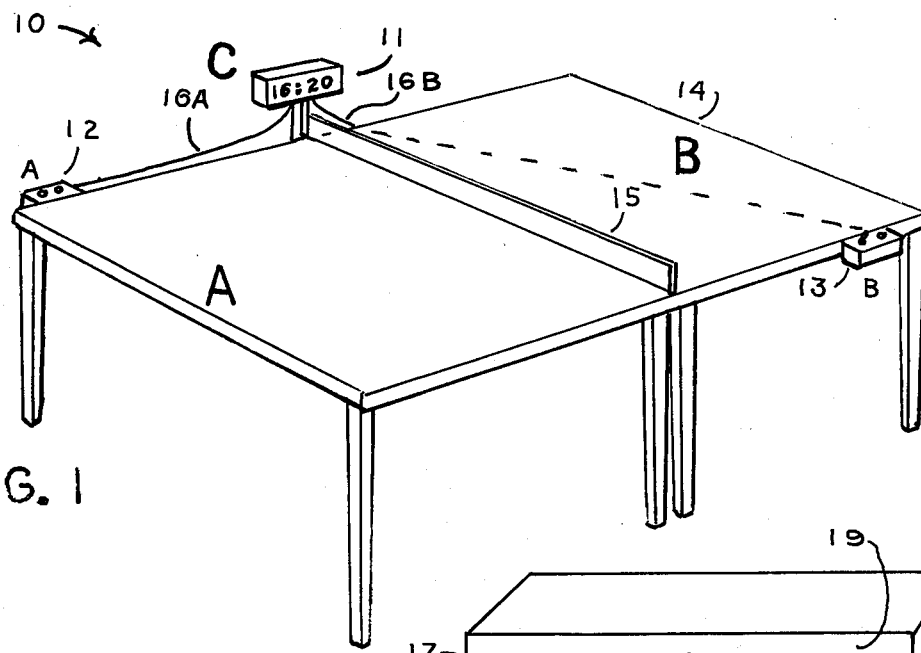
FIG. 1 is a perspective view showing the electronic scorekeeper of the invention mounted on a ping pong table.

Referring more particularly to the drawing by characters of reference, FIGS. 1-4 disclose the electronic score-keeper of the invention comprising a display unit 11 and first and second control stations 12 and 13 mounted on a ping pong table 14. In the preferred embodiment of the invention the display unit 11 is mounted at one side of table 14 at the end of a net 15 where it may be viewed by either player. The first control station 12 is mounted at one side of the table near the end occupied by player A, preferably at the left side of player A as he faces the table. The second control station 13 is mounted at the side of the table near its opposite end which is occupied by player B, preferably at player B's left side as he faces the table. A first signal cable 16A connects display unit 11 to control station 12, and a second signal cable 16B connects display unit 11 to control station 13.

Figure 2:
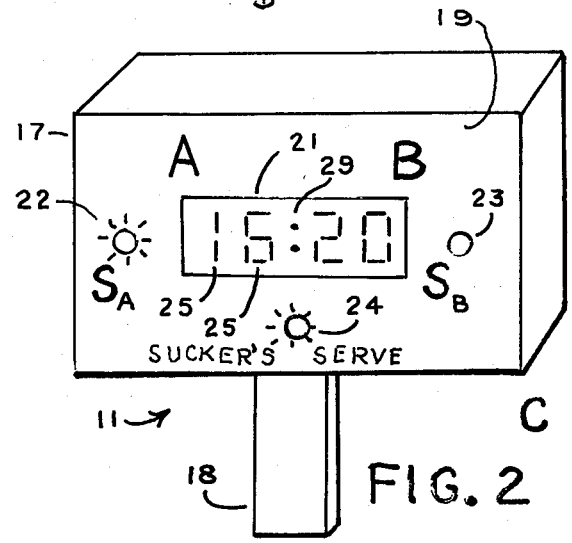
FIG. 2 is a perspective view of a display unit which comprises the score-and-serve read-out unit comprising one element of the score-keeper shown in FIG. 1.

The display unit 11, as shown most clearly in FIG. 2, comprises a housing 17 equipped with a mounting bracket 18 and carrying on its face 19 a digital read-out device 21 and first, second and third indicator lamps 22, 23 and 24. Lamp 22 or 23 is energized to indicate that player A or player B, respectively, is entitled to serve. Lamp 24 is the "SUCKER-SERVE" indicator, and it is energized when either player reaches a score of twenty points. When lamp 24 is energized neither lamp 22 nor lamp 23 will be lighted and a rule known as the "Sucker-Serve" rule goes into effect. Under this rule, the first player to reach twenty points surrenders the next serve to the other player. The serve then alternates each turn until one player or the other attains a two-point lead to win the game. This is a generally accepted rule of the game.

Figures 5, 6:
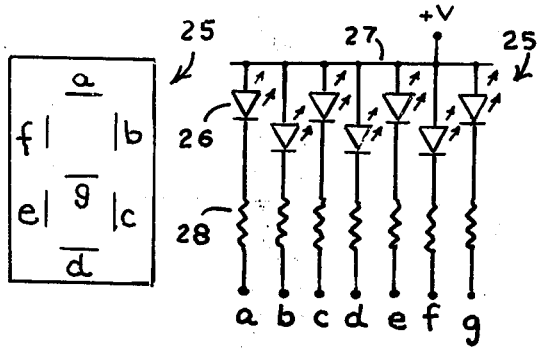
FIG. 5 is a representation of a standard seven-segment digital read-out element which is employed in the display unit of FIG. 2.
FIG. 6 is a diagrammatic representation of the electronic circuit embodied in the read-out element of FIG. 5.

FIGS. 5 and 6 show the mechanical arrangement and circuit diagram, respectively, of a seven-segment display element 25 employed in the read-out device 21 of unit 11. Each of the four digits of device 21, as shown in FIG. 2, comprises a seven-segment element as shown in FIG. 5. The seven segments $a$ through $g$ are arranged in a figure 8 pattern. By selectively energizing and lighting two or more of the seven segments, any digit from zero to nine may be formed. Thus, for example, segments $b$ and $c$ are energized to form a "one", segments $a, b, g, e$ and $d$ form a "two", etc. Electrically, each segment may be a light-emitting diode or a gas-discharge element integrally incorporated in the structure of the read-out device 21. FIG. 6 shows the electrical connection of seven light-emitting diodes 26 to form the element 25. The anodes of the seven diodes 26 are connected to a common-anode conductor 27, and a current-limiting resistor 28 is connected from the cathode of each diode to a corresponding output terminal. The seven output terminals are identified by the seven lower-case letters $a$ through $g$. Ordinarily, the current-limiting resistors are not incorporated in the display device itself but are connected externally. For simplification they are here assumed to be incorporated in the display element 25.

Device 21 of FIG. 2 comprises four of the elements 25 of FIG. 5 incorporated into a single device 21. Two illuminated dots 29 arranged in the form of a colon may optionally be provided and positioned between the first and second pairs of elements 25 to set apart the scores of the two players. This arrangement is readily available at a low cost because it is commonly employed as a read-out for a digital clock.

Figure 7:
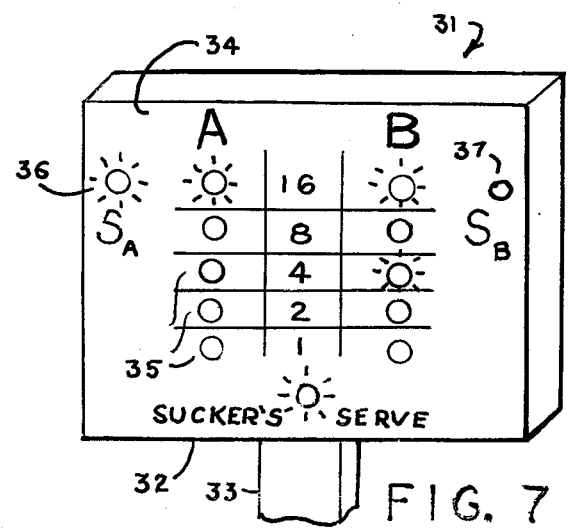
FIG. 7 is a perspective view of a second embodiment of a display unit which may be employed as an alternative to the display unit shown in FIG. 2.

The optional display unit 31 of FIG. 7 comprises a housing 32 with a mounting post 33 and with a number of indicator lamps arranged on its front face 34 to display the score and serving responsibility. Electronic circuits which control the indicator lamps in response to signals received from the control stations 12 and 13 are mounted inside the housing 32 along with batteries or other power supply.

Display unit 31 utilizes ten indicator lamps 34 arranged in two columns of five lamps each to display the running score in binary code. The first column identified as Column A displays the score of player A, and the second column identified as column B displays the score of player B. Each of the five lamps in each column represents a power of two as indicated by the column of numbers positioned between the two columns of indicator lamps. Thus, the lower lamp or row represents the base "two" raised to the zero power (1), the second row represents "two" to the first power (2), the third row, "two" to the second power (4), the fourth row, "two" to the third power (8), and the fifth row, "two" to the fourth power (16). The instant score is shown by the energization of lamps in the appropriate columns and rows. Thus, for example, when player A has a score of twenty-one points, the top, center and bottom lamps of column A will be energized. The numbered identification of each row may be shown as an aid to the players in reading the score but should become unnecessary with use as the players gain familiarity with the binary code.

As in the case of the display unit 11 of FIG. 2, two indicator lamps 36 and 37 are utilized to display serving responsibility, and an optional "Sucker's Serve" lamp may be utilized to indicate that the "Sucker Serve" rule has gone into effect.

Figure 3:
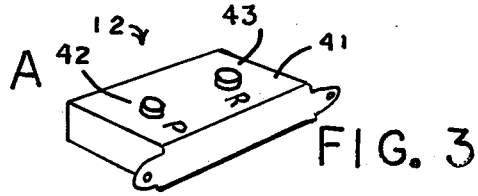
FIG. 3 is a perspective view of one of the scoring stations comprising a second element of the electronic scorekeeper shown in FIG. 1.

The control station 12 of FIG. 3 comprises a housing 41, a first push-button switch 42 for registering the points scored by player A and a second push-button reset switch 43 which is used to reset the counters and control circuits of the score-keeper 10 to zero at the start of each game.

Figure 4:
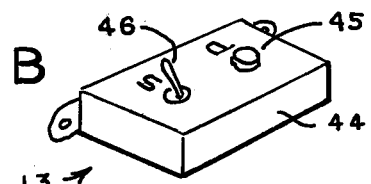
FIG. 4 is a perspective view of a second scoring station comprising a third element of the electronic score-keeper shown in FIG. 1.

Control station 13 of FIG. 4 is similar to station 12, having a housing 44, a push-button switch 45 for registering the points scored by player B, and a double-pole-double-throw switch 46 which may be employed to provide an optional control feature to be discussed later.

Figures 8, 9, 10, 11:
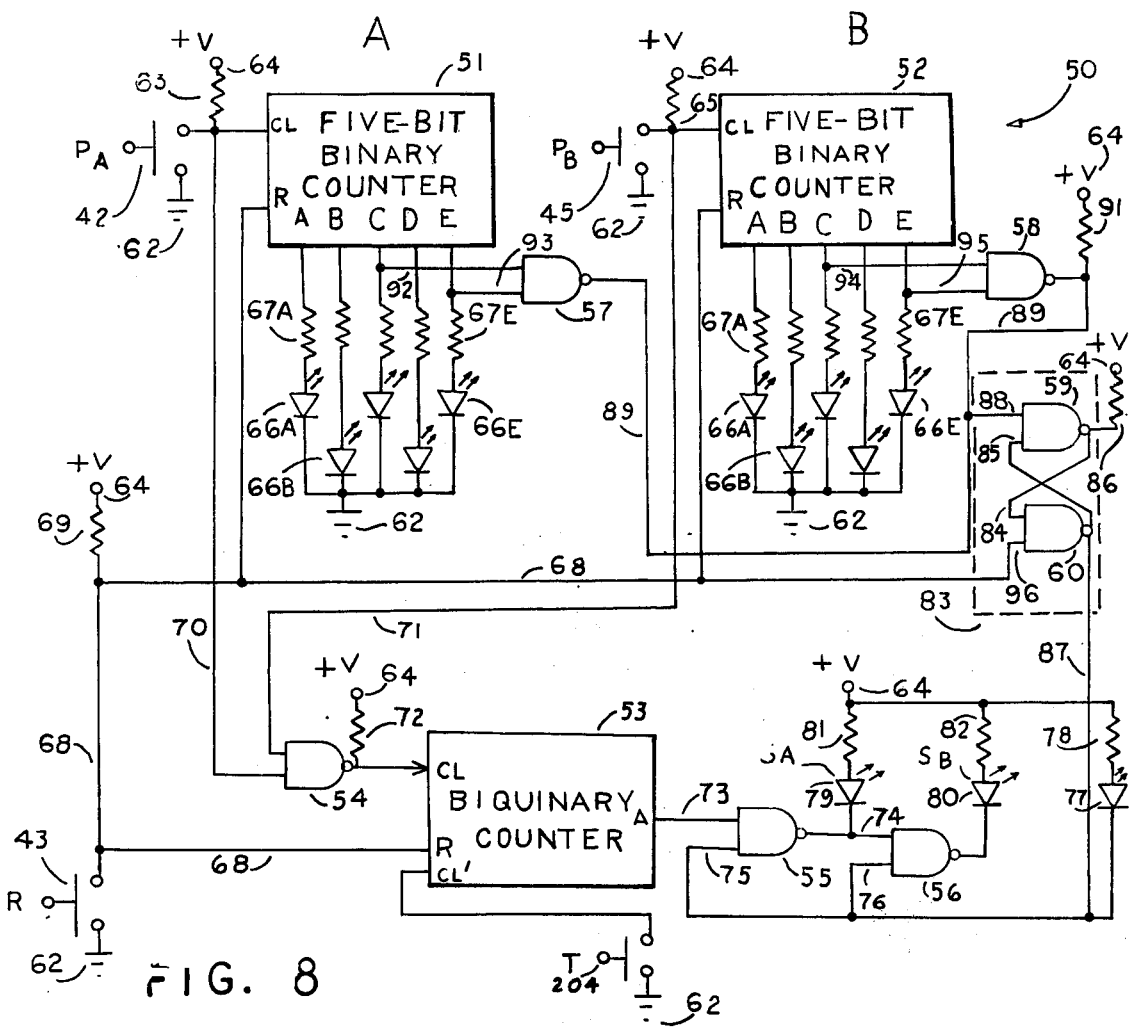
FIG. 8 is a circuit diagram of a second embodiment of the invention which employs the display unit shown in FIG. 7.
FIG. 9 is a truth table for a BCD counter which is employed as an element of the electronic circuits utilized in the implementation of the invention.
FIG. 10 is a truth table for a biquinary counter which is employed as another element of the electronic circuits utilized in the implementation of the invention.
FIG. 11 is a truth table of a BCD to seven-segment decoder-driver which is employed as still another element of the electronic circuits utilized in the implementation of the invention.

FIG. 8 shows a simple electronic control circuit 50 which may be employed in conjunction with the display unit 31 of FIG. 7 and with the control stations 12 and 13 of FIGS. 3 and 4. The major elements of the control circuit 50 of FIG. 8 include two five-bit binary counters 51 and 52, a biquinary counter 53, eight open-collector NAND gates 54 through 50, and the switches 42, 43 and 45 of control stations 12 and 13.

The five-bit binary counters 51 and 52 are extensions of the more common four-bit binary counter which is readily available as an integrated circuit from a number of manufacturers. Fairchild Semiconductor, Mountain View, California produces such a device identified as a TTL/MSI 9356 4-bit Binary Counter and describes its characteristics and operation in the Fairchild Semiconductor TTL Data Book of June 1972 on pp. 8–188 to 8–190.

Very briefly, the common four-bit Binary Counter has four output terminals, A, B, C, and D, a clock input terminal CL and a reset terminal R. The four output terminals are utilized to indicate in binary code the value of the number stored in the counter, each output representing a power of "two" such that ouput A will be high or low to show a "1" or "0" in the units column, output B will be high or low to show a "1" or "0" in the "two's" column, output C indicates a "1" or "0" in the "four's" column, and output D a "1" or "0" in the "eight's" column. The counter may be set to zero by momentarily grounding the reset terminal (R). In this condition all of the outputs A–D are low (L). The first clock pulse sets the "A" output "high" corresponding to a count of "1". The second clock pulse sets the "B" output "high" and all others "low" to show a count of "2", etc. The maximum decimal value obtainable in a four-bit binary counter is 15 with all outputs high (1 + 2 + 4 + 8 = 15).

Because in the game of ping pong the winning score always exceeds twenty points, it is necessary to add a fifth bit corresponding to the fourth power of two (16). The maximum count in this case is 31. A four-bit binary counter may be converted to a five-bit counter by adding another stage (flip-flop).

The biquinary counter 53 is a standard integrated circuit available from a number of manufacturers as a type 74196 which may be connected either as a decade (BCD) counter or as a biquinary counter. Fairchild describes its characteristics, connections and operation in its TTL Data Book referenced earlier on pp. 8–297. to 8–300. Fig. 10 shows a "truth table" for the biquinary connection. Output conditions are shown for the four output terminals A, B, C and D for ten clock counts (CL) from 0 to 9. It will be noted that the "A" output changes state (high or low) every five clock counts. The "A" output is employed in the monitoring circuits of the invention for keeping track of the serving responsibility.

The NAND gates 54–60 are open-collector types similar to the 74H01 as described in the Fairchild Data Book, p. 5–30. The 74H01 is a TTL integrated circuit having two input terminals and an output terminal. The output level is "low" (near zero volts) when both inputs are "high" (4.0 to 5.0 volts). For all other input conditions the output is high. The output stage of the gate is an NPN transistor with its emitter connected to ground and its collector connected to the output terminal. There is no collector resistor of pull-up resistor so that either a high impedance (NPN transistor turned off) or a low impedance to ground (NPN transistor turned on) is seen at the output terminal. An external pull-up resistor or other load is ordinarily connected at the output terminal.

As shown in FIG. 8, the first five-bit binary counter 51 is employed to register the score of player A, and the second five-bit binary counter 52 is employed to register the score of player B. Switch 42 has its first terminal connected to the clock input terminal (CL) of counter 51 and its second terminal is connected to ground terminal 62. A pull-up resistor 63 is connected from clock terminal (CL) to a positive voltage source 64 (+5 volts for TTL circuits). In the same manner, switch 45 and a pull-up resistor 65 are connected at clock terminal (CL) of counter 52. From each of the five output terminals A–E of the two counters 51 and 52 a light-emitting diode 66A–66E and a serially connected current-limiting resistor 67A–67E are connected to ground terminal 62. The reset terminals (R) of the two counters 51 and 52 are connected to a common reset line 68. One terminal of reset switch 43 is connected to reset line 68; the other terminal of switch 43 is connected to ground terminal 62. A pull-up resistor 69 is connected from reset line 68 to source terminal 64. Each of the counters 51 and 52 has a five-volt supply terminal connected to source 64 and a ground terminal connected to terminal 62. These connections are not shown in FIG. 8. The counters 51 and 52, the switches 42, 43 and 45, the light-emitting diodes 66, and the resistors 63, 65, 67 and 69 connected as just described comprise the score-keeping portion of circuit 50.

Operation of the score-keeping portion of the circuit 50 occurs as follows: After the circuit has been energized by the application of source 64 the RESET switch 43 is operated to reset the counters 51 and 52 to zero. Switch 43 is normally open and closes momentarily when it is operated by means of a push-button mechanism. As switch 43 closes momentarily the voltage on reset line 68 falls from +5 volts (+V) to zero. The counters 51 and 52 which have their reset terminals connected to line 68 are reset to zero as the voltage on line 68 falls to zero. The circuit is now ready for use. As each player gains a point he depresses his scoring switch 42 or 45. The switches 42 and 45 are also normally open and close momentarily when they are operated by means of push button. Thus, for example, if player A makes the first point, he depresses switch 42. As switch 42 closes, it momentarily grounds clock terminal CL of counter 51, causing the voltage at terminal CL to fall from +V to ground. The negative transition in voltage at terminal CL causes the counter 51 to be advanced one count, in this case from "zero" to "one". The lowest order output terminal A is set accordingly from low to high and light-emitting diode 66A is energized to indicate a score of "one" for player A. Upon scoring another point, player A again operates switch 42 and counter 51 is advanced to a count of "two" for which output terminal B goes high and all other outputs go low so that light-emitting diode 66B is energized to indicate the score of "two". Player B operates switch 45 to register his score and counter 52 responds as in the case of counter 51.

The remaining elements of FIG. 8, including the biquinary counter 53 and the gates 54–60, comprise the SERVE indicator control circuit. Gate 54 has its first input terminal connected by a conductor 70 to clock terminal CL of counter 51, and its second input terminal is connected by a conductor 71 to clock terminal CL of counter 52. The output terminal of gate 54 is connected to the clock terminal CL of biquinary counter 53 and through a pull-up resistor 72 to source 64. The reset terminal R of counter 53 is connected to common reset line 68. Output terminal A of counter 53 is connected to the first input terminal 73 of gate 55 and the output terminal of gate 55 is connected to the first input terminal 74 of gate 56. The second input terminals 75 and 76, respectively, of gates 55 and 56 are both connected to the cathode of a light-emitting diode 77 which is the SUCKER'S SERVE indicator or lamp. The anode of diode 77 is connected through a current-limiting resistor 78 to source 64. Light-emitting diodes 79 and 80, which are the SERVE indicators for players A and B, respectively, have their cathodes connected, respectively, to the output terminals of gates 55 and 56. The anodes of diodes 79 and 80 are connected through current-limiting resistors 81 and 82, respectively, to source 64.

The two gates 59 and 60 are connected together to form a flip-flop 83, the output terminal of gate 59 being connected to the first input terminal 84 of gate 60 and the output terminal of gate 60 being connected to the first input terminal 85 of gate 59. The output terminal of gate 59 is connected through a current-limiting resistor 86 to source 64, and the output terminal of gate 60 is connected by a conductor 87 to the cathode of diode 77. The second input terminal 88 of gate 59 is connected by a conductor 89 to one end of a pull-up resistor 91, the other end of which is connected to source 64.

Gates 57 and 58 monitor conditions for initiation of the SUCKER'S SERVE rule, each having its input terminals connected to the appropriate output terminals of counters 51 and 52. Thus, gate 57 has one input terminal 92 connected to output terminal C (the "four" output) and the other input terminal 93 to output terminal E (the "sixteen" output) of counter 51. Similarly, gate 58 has its first and second input terminals 94 and 95 connected, respectively, to output terminals C and E of counter 52. The output terminals of gates 57 and 58 are both connected to conductor 89 and to the second input terminal 88 of gate 59. The second input terminal 96 of gate 60 is connected to reset line 68.

When RESET switch 43 is operated at the start of each game, flip-flop 83 is reset as line 68 is grounded, the "reset" condition of flip-flop 83 being such that when the outputs A-E of counters 51 and 52 are initially low (corresponding to starting scores of "zero" for players A and B), the output terminals of gates 57 and 58 and consequently the input terminal 88 of gate 59 are initially high so that flip-flop 83 is constrained to remain in the "reset" state. Because in this state the output of gate 60 is high, the common input terminals 75 and 76 of gates 55 and 56 as well as the cathode of diode 77 are also initially high, and diode 77 is deenergized. Because counter 53 is initially set to the "zero" condition, its output terminal A is low as indicated by the "truth table" of FIG. 10.

Now as either player A or B operates switch 42 or 45 to register a point, conductor 70 or 71 momentarily drops to zero volts so that one or the other of the two input terminals of gates 54 momentarily goes to zero and its output terminal momentarily rises toward the positive potential of source 64, then falls again to zero. As the output of gate 54 falls to zero, counter 53 advances one count. It is apparent, therefore, that counter 53 is advanced one count for each point scored whether it is made by player A or by player B, with the result that the output of counter 53 changes state each time the total of the scores of players A and B reaches a multiple of five. Thus, for the first five points made, the output terminal A of counter 53 is low, for the second five points it is high, for the third five points it is low, etc. During the time that output terminal A of counter 53 is low, the output terminal of gate 55 is high so that diode 79 is de-energized. Because the output terminal of gate 55 is high, however, the connected input terminal 74 of gate 56 is high, as is the other input terminal 76 by virtue of its connection to conductor 87. The output terminal of gate 56 is thus low so that diode 80 is energized to indicate that player B has the serve. When output terminal A of counter 53 goes high after five points are made, the output terminal of gate 55 goes low, energizing diode 79 to indicate player A has the serve while the output of gate 56 goes high to de-energize diode 80.

When either player A or B attains a score of twenty points, both input terminals of one of the gates 57 or 58 will switch to a high condition causing conductor 89 and input terminal 88 of gate 59 to go to a low condition which sets flip-flop 83 and causes the output terminal of gate 60 to go low. As a consequence line 87 goes to approximately zero volts, energizing the SUCKER'S SERVE indicator, diode 77, and causing the outputs of both gates 55 and 56 to go high so that SERVE indicator diodes 79 and 80 are both de-energized. The players A and B must now observe the SUCKER'S SERVE rule until the end of the game without further help from the display unit 31. The flip-flop 83 remains in the "set" state until the reset switch 43 is operated at the beginning of the next game.

Figure 12:
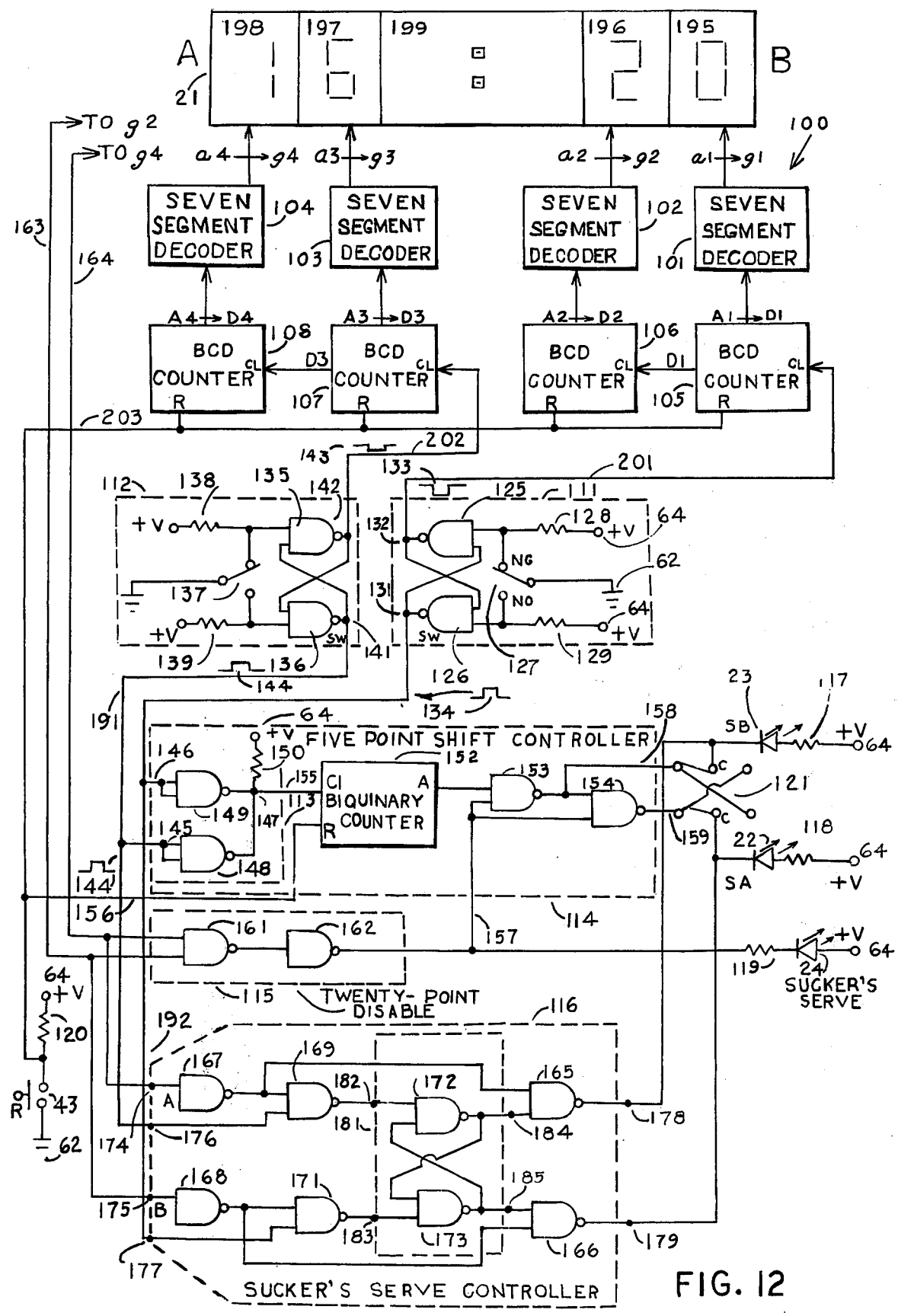
FIG. 12 is a diagram of the electronic circuit utilized in the first embodiment of the invention.

The more elaborate control circuit 100 of FIG. 12 is employed in conjunction with the display unit 11 of FIG. 2. Circuit 100 is mounted on a circuit board located inside housing 17 of unit 11. As shown in FIG. 12, control circuit 100 comprises four seven-segment decoder-drivers 101, 102, 103 and 104, four binary-coded decimal counters, 105, 106, 107 and 108, two buffered scoring switches, 111 and 112, a NOR gate 113, a FIVE-POINT SHIFT controller 114, a TWENTY-POINT DISABLE network 115, a SUCKER'S SERVE controller 116, current-limiting resistors 117, 118 and 119, a pull-up resistor 120, a FIRST-SERVE transfer switch 121, and the RESET switch 43. The circuit 100 controls the energization of the display 21 and of the serve indicators 22, 23 and 24 which are also shown in FIG. 2.

The seven-segment decoder-driver is a commonly employed integrated circuit having four input terminals and seven output terminals. The decoder-driver receives binary-coded data at its four input terminals as required to drive the corresponding segments of a seven-segment display element. Thus, for example, if the decoder-driver has its seven output terminals connected to the corresponding seven input terminals of a seven-segment display element and if it receives at its input terminals the binary-coded digit "2", which in binary notation is given is given as 0010, five of its seven output terminals will be grounded, the grounded output terminals energizing segments $a$, $b$, $g$, $e$ and $d$ of the display element. By reference to FIGS. 5 and 6, it may be verified that when these five terminals of the display element are grounded, a decimal digit "2" will be displayed. Seven-segment decoders of this type are available from a number of manufacturers. Fairchild Semiconductor, for example, describes on pp. 8-191 to 8-196 if uts TTL Data Book (June 1972) a decoder driver identified as a 7447. This is the device that was employed in the first working model of the present invention. In the case of the 7447, the selected output terminals are driven to a low (L) state and are intended for use with common-anode displays, as shown in FIG. 6. In other decoder-drivers the selected outputs are driven high for use with common-cathode displays.

The binary-coded decimal counter (BCD Counter) is also a commonly available integrated circuit having a clock input terminal CL, four output terminals A, B, C and D, and a reset terminal R. The BCD counter is reset to zero by momentarily grounding the reset terminal R. In the "reset" condition all of the output terminals are set low (L). Each successive clock pulse applied thereafter advances the count by one so that the binary-coded data appearing at its output terminals A-D progresses from 0000 to 0001 to 0010 etc. until it reaches the count of nine (1001), whereupon the next clock pulse returns the output to zero (0000). This sequence of operation is illustrated in the BCD counter "truth table" of FIG. 9. The BCD counter employed in the first implementation of the present invention is a 74196, the same device that was employed as the biquinary counter 53 of circuit 50. The 74196 may be connected to function as a biquinary counter or as a BCD counter and is commonly employed in both applications. Connections for each of the two applications are given in the Fairchild TTL Data Book.

The buffered switches 111 and 112 of circuit 100 are employed in preference to simple mechanical switches because mechanical switches tend to bounce when they are operated. When this occurs a series or burst of pulses is generated which appear to the connected counters as several clock pulses rather than the intended single pulse. As a consequence, counting errors occur and the effectiveness of the score-keeping circuit is destroyed. The buffered switches 111 and 112 are not subject to this problem.

As shown in FIG. 12, the buffered switch 111 comprises two two-input NAND gates 125 and 126, a three-terminal, momentary-action mechanical switch 127 and two pull-up resistors 128 and 129. Switch 127 has a common terminal C, a normally closed terminal NC, and a normally open terminal NO. Its common terminal C is connected to ground terminal 62. Gate 125 has its first input terminal connected to the output terminal 131 of gate 126; its second input terminal is connected to the NC terminal of switch 126 and through resistor 128 to +5 volt source 64. Gate 126 has its first input terminal connected to output terminal 132 of gate 125; its second input terminal is connected to the NO terminal of switch 127 and through resistor 129 to source 64. NAND gates 125 and 126 are of a type 74H00 (p. 5-29 of the 1972 Fairchild TTL Data Book) which requires no external pull-up resistor. The two NAND gates 125 and 126 connected as just described form a flip-flop which may be set or reset by the switch 127. In the rest position of switch 127, as shown in FIG. 12, one input terminal of gate 125 is grounded through switch 127 so that the output terminal 132 of gate 125 is high and the output terminal 131 of gate 126 is low. When switch 127 is momentarily operated, contact is made between its NO terminal and the common terminal C so that an input terminal of gate 126 is grounded, causing its output terminal 131 to go high and output terminal 132 of gate 125 to go low. When switch 127 is permitted to return to its rest position, terminal 132 returns to a high condition and terminal 131 to a low condition. The momentary action of the switch 127 thus produces a negative pulse 133 at terminal 132 and a positive pulse 134 at terminal 131. The bouncing action of the switch 127 in either the NC or NO position has no effect because the flip-flop is set or reset at the first instant of contact and remains so through any number of subsequent closures at the same contact.

Switch 112 is identical to switch 111 and is comprised of two NAND gates 135 and 136, a mechanical switch 137 and and pull-up resistors 138 and 139. Interconnections are the same as those of switch 111. The operation of mechanical switch 137 produces a positive pulse 144 at output terminal 141 of gate 136 and a negative pulse 143 at output terminal 142 of gate 135.

In the practice of the invention, the mechanical switches 137 and 127 are mounted in the control units 12 and 13, respectively, of FIGS. 3 and 4 where they are identified as switches 42 and 45.

The NOR gate 113 has two input terminals 145 and 146 and a single output terminal 147. Gate 113 comprises two open-collector NAND gates 148 and 149 and a pull-up resistor 150. The output terminals of both gates are connected to output terminal 147 and through resistor 150 to source 64. Both input terminals of gate 148 are connected to terminal 145 of gate 113 and both input terminals of gate 149 are connected to terminal 146 of gate 113. (Note: When connected in this manner, each NAND gate functions as a simple inverter, and an inverter could be substituted, but it is convenient to limit the total number of part types.) In the operation of gate 113, a positive pulse at either input terminal 145 or 146 produces a negative pulse at output terminal 147.

The five-point shift controller 114 comprises a biquinary counter 152 and two open-collector NAND gates 153 and 154; it has a clock input terminal 155, a reset terminal 156, a disable terminal 157 and two output terminals 158 and 159. The counter 152 is identical with the counter 53 of circuit 50, and the NAND gates 153 and 154 are identical with gates 54-60 of circuit 50. Output terminal A of counter 152 is connected to the first input terminal of gate 153. The output terminal of gate 153 is connected to the first input terminal of gate 154 and to the first output terminal 158 of controller 114. The second input terminal of gate 153 and the second input terminal of gate 154 are connected to disable terminal 157, and the output terminal of gate 154 is connected to output terminal 159 of controller 114.

The FIRST-SERVE transfer switch 121 has six terminals arranged in two rows of three terminals each. Switch 121 is a conventional double-pole double-throw switch in which the center two terminals are common. As in the typical double-pole, double-throw switch, switch 121 has two positions: In the one position contact is made between the common terminal in each row and one of the outer terminals in the same row; in the other position, contact is made in each row between the common terminal and the other outer terminal in the same row. Conversion for use as a transfer or reversing switch is accomplished by connecting the diagonally opposite outer terminals together, as shown in FIG. 12.

The serve indicators 22 and 23 are light-emitting diodes which are mounted on the front of the display unit 11, as shown in FIG. 2. Diode 22 and serially connected resistor 118 are connected between one of the common terminals C of switch 121 and source terminal 64, while diode 23 and resistor 117 are serially connected between the other common terminal C of switch 121 and source terminal 64. The output terminals 158 and 159 of the controller 114 are connected, respectively, to first and second outer terminals on one side of switch 121. The diodes 22 and 23 are polarized to pass current flow from terminal 64 to the common terminals of the switch 121.

It will be noted that when switch 121 is in the position shown in FIG. 12 there is continuity from the diode 23 to terminal 158 of controller 114 and from diode 22 to terminal 159 of controller 114. When the switch 121 is thrown to its other position, continuity is effected between diode 23 and terminal 159 through one of the diagonal switch connections and also between diode 22 and terminal 158 via the other diagonal switch connection. The switch 121 thus permits the transfer of the two SERVE indicator diodes 22 and 23 between the two output terminals of the controller 114 so that FIRST-SERVE designation may arbitrarily be assigned to player A or to player B at the start of a game. The switch 121 of FIG. 12 corresponds to the switch 46 of FIG. 4.

The TWENTY-POINT DISABLE network 115 comprises two NAND gates 161 and 162. Gate 162 is an open-collector type, as defined earlier, while gate 262 has an internal pull-up circuit, a type also discussed in an earlier part of this specification. The two input terminals of gate 162 are tied together and connected to the output terminal of gate 161. The output terminal of gate 126 is connected to disable terminal 157 of controller 114. Also connected to the output terminal of gate 162 from source terminal 64 are the SUCKER'S SERVE indicator diode 24 and its serially connected current-limiting resistor 118, the diode 24 being polarized to pass current from terminal 64 to gate 126. One of the two input terminals of gate 161 is connected via conductor 136 to output terminal g of decoder 102, and the other input terminal of gate 161 is connected via conductor 164 to output terminal g of decoder 104.

The SUCKER'S SERVE controller 116 comprises two opencollector NAND gates 165 and 166 and six NAND gates 167, 168, 169, 171, 172 and 173 of the type requiring no external pullup. Controller 116 has four input terminals 174, 175, 176 and 177 and two output terminals 178 and 179.

Gates 172 and 173 are connected to form a flip-flop 181 which has two input terminals 182 and 183 and two output terminals 184 and 185. The output terminal of gate 172 is connected to flip-flop output terminal 184 and to the first input terminal of gate 173, while the output terminal of gate 173 is connected to flip-flop output terminal 185 and to the first input terminal of gate 172. The second input terminal of gate 172 is connected to the first input terminal 182 of flip-flop 181 and the seond input terminal of gate 173 is connected to the second input terminal 183 of flip-flop 181.

Input terminals 174, 175, 176 and 177 of controller 116 are internally connected to the first input terminals, respectively, of gates 167, 168, 169 and 171. The output terminals of gates 167 and 168 are connected, respectively, to the second input terminals of gates 169 and 171, and the output terminals of gates 169 and 171 are connected, respectively, to the input terminals 182 and 183 of flip-flop 181. Gates 167 and 168 which invert the signals from decoders 104 and 102, respectively, may be omitted if input signals of opposite polarity are available for direct coupling to gates 169 and 171. Gates 165 and 166 have their output terminals connected, respectively, to output terminals 178 and 179 of controller 116. The first input terminals of gates 165 and 166 are connected, respectively, to output terminals 184 and 185 of flip-flop 181, and the second input terminals of gates 165 and 166 are connected, respectively, to the output terminals of gates 167 and 168.

Controller output terminal 178 is connected to the common terminal C of switch 121 to which diode 23 is connected, and terminal 179 is connected to the other common terminal C of switch 121 to which diode 22 is connected. Input terminal 174 of controller 116 is connected through conductor 164 to output terminal g of decoder 104, input terminal 175 is connected through conductor 163 to output terminal g of decoder 102, input terminal 176 is connected via a conductor 191 to output terminal 141 of gate 136 of switch 112, and input terminal 177 is connected via a conductor 192 to output terminal 131 of gate 126 of switch 111.

The output terminal of gate 131 of switch 111 is also connected to input terminal 146 of NOR gate 113, and the output terminal 141 of gate 136 of switch 112 is connected to input terminal 145 of NOR gate 113. The output terminal 147 of gate 113 is connected via a conductor 194 to input terminal 155 of FIVE-POINT SHIFT controller 114.

The display 21 comprises four seven-segment digital display elements 195, 196, 197 and 198 arranged in two pairs separated by a colon 199, the first pair of elements comprising elements 195 and 196 display the score of player A, and the second pair of elements 197 and 198 display the score of player B. In the preferred embodiment, the colon is implemented by means of light-emitting diodes which are always energized to set the two scores apart for better distinction therebetween. Each of the elements 195-198 seven control terminals a–g which are grounded to energize selectively the corresponding elements a–g as shown in FIGS. 5 and 6. It is assumed that individual current-limiting resistors are internally mounted as discussed earlier and as shown in FIG. 6.

The seven output terminals a–g of the decoders 101, 102, 103 and 104 are connected respectively to the corresponding control terminals a–g of the display elements 195, 196, 197 and 198 so that decoder 101 controls element 195, decoder 102 controls element 196, decoder 103 controls element 197, and decoder 104 controls element 198.

The four output terminals A1-D1 of counter 105 are connected to the corresponding input terminals of decoder 101, output terminals A2-D2 of counter 106 are connected to the corresponding input terminals of decoder 102, output terminals A3-D3 of counter 107 are connected to the corresponding input terminals of decoder 103, and the output terminals A4-D4 of counter 108 are connected to the corresponding input terminals of decoder 104. Output terminal D1 of counter 105 is also connected to clock terminal CL of counter 106, and output terminal D2 of counter 107 is also connected to clock terminal CL of counter 108. The clock terminal CL of counter 105 is connected by a conductor 201 to the output terminal 132 of gate 125 of switch 111, and the clock terminal CL of counter 107 is connected by a conductor 202 to the output terminal 142 of gate 135 of switch 112.

One terminal of the RESET switch 43 is connected to ground terminal 62; the other terminal is connected to a common RESET line 203 and through pull-up resistor 120 to source 64. The RESET line 203 is connected to the RESET terminals R of counters 105-108 and to terminal 156 of controller 114.

The score-keeping function of the circuit 100 involves only the buffered switches 111 and 112, the RESET switch 43, the counters 105-108, the decoder-drivers 101-104 and the display 21. At the start of a game the normally open RESET switch 43 is momentarily closed to reset the counters 105-108 to zero by grounding the common RESET line 203. As the game progesses, each player registers his own points as he makes them by depressing switch 127 or 137. As explained earlier, the momentary action of the switch 127 or 137 produces at output terminal 132 or 142 a negative pulse 133 or 143 which is delivered to the clock terminal CL of counter 105 or 107 by conductor 201 or 202, respectively. The counters 105 and 107 are advanced one count by each successive pulse 133 or 143 until reaching a count of nine. On the tenth pulse received, counter 105 or 107 is reset to zero and the connected counter 106 or 108 is advanced to a count of "one" which remains until the associated counter 105 or 107 has registered an additional ten counts. The seven-segment decoders 101-104 respond to the data stored in the counters 105-108 by displaying the running score.

Meanwhile, counter 152 of the FIVE-POINT SHIFT controller 114 receives the pulse from gate 113 at its clock terminal CL each time player A or player B scores a point. During the scoring of the first five points, the output terminal A of counter 152 is low, output terminal 158 is high and terminal 159 is low. Assuming switch 121 is in the position shown in FIG. 12, SERVE indicator 22 is thus energized and SERVE indicator 23 is de-energized during the first five points made. Upon the scoring of the fifth point, terminal A switches to a high state, terminal 158 switches to a low state and terminal 159 to a high state whereupon indicator 23 is energized and indicator 22 is de-energized. At each multiple of five points scored, the states of the indicators 22 and 23 are reversed in this manner to indicate that player A or player B is to serve.

Prior to the scoring of twenty points by either player A or player B, the output terminals g4 and g2, respectively, of decoders 104 and 102 are high. The high levels at terminals g4 and g2 are transmitted to the input terminals of gate 161 of the TWENTY-POINT DISABLE network 115 by conductors 164 and 163. The output terminal of gate 161 is thus held at a low level which causes the output terminal of the connected gate 162 and the disable terminal 157 to be held at a high level. The high level at terminal 157 enables the gates 153 and 154 to respond to counter 152 as described in the preceding paragraph, and at the same time sustains the SUCKER'S SERVE indicator 24 in a de-energized condition. When either player reaches a score of twenty points, output terminal g2 or g4 of decoder 102 or 104, respectively, falls to a low level which is transmitted to one of the input terminals of gate 161 by conductor 163 or 164, causing the output terminal of gate 161 to be switched to a high level. The output of gate 162 responds by switching to a low level. The low level thus produced at disable terminal 157 causes the output terminals of both gates 153 and 154 to switch to high levels regardless of the state of counter 152, and neither of the indicators 22 or 23 is energized by FIVE-POINT SHIFT controller 114, while the low level at terminal 157 causes the SUCKER'S SERVE indicator 24 to be energized indicating that the SUCKER'S SERVE rule is in effect. From this point on, assuming for the moment that the SUCKER'S SERVE controller 116 is not provided, the players A and B must determine for themselves at each turn which player has the serve.

As an added convenience in the complete embodiment of the invention, the SUCKER'S SERVE controller 116 may be incorporated to continue the proper indication of serving responsibility through the energizing of indicators 22 and 23 to the completion of the game. The operation of the controller 116 occurs as follows:

Prior to the scoring of twenty points by either player, input terminals 174 and 175 which are connected respectively to output terminals g4 and g2 of decoders 104 and 102 by conductors 164 and 163 are held in a high state and the output terminals of gates 167 and 168 are accordingly low. The low states at the output terminals of gates 167 and 168 cause the open-collector output stages of gates 165 and 166 to remain non-conductive independent of the signal levels received from the output terminals of flip-flop 181 so that full control of the SERVE indicators 22 and 23 is retained by controller 114. When player A or player B achieves a score of 20 points, however, one of the output terminals g4 or g2 and hence one of the input terminals 174 or 175 switches to a low state, which low state causes the output terminal of gate 167 or 168 to switch to a high state, thereby enabling gate 165 or 166.

For the sake of explanation, it will be assumed that player A reaches twenty points when player B has a score of eighteen points. Terminal g4 of decoder 104 is thus at a low state and terminal g2 of decoder 102 is at a high state. Accordingly, input terminals 174 and 175 are low and high, respectively, and the output terminals of gates 167 and 168 are respectively high and low. These conditions are set at the initiation of the pulse 143 which is generated at the output terminal 142 of switch 112, during the registration of the twentieth point by player A. During the remainder of the pulse 143, the simultaneous positive pulse 144 is delivered by conductor 191 to input terminal 176 of controller 116. The positive levels sustained at this time at the output terminal of gate 167 and at terminal 176 are received at the input terminals of gate 169 and cause the output terminal of gate 169 to switch to a low level and to remain there for the duration of pulse 144. During this time the flip-flop 181 is set to the condition in which its output terminals 184 and 185 are respectively high and low. At the termination of the pulse 144, the output terminal of gate 169 returns to a high state, but the flip-flop 181 sustains the condition previously set. Because at this time the levels at the output terminal of gate 167 and at terminal 184 of flip-flop 181 are both high, the output terminal of gate 165 is low and gate 165 thus energizes indicator 23 through conductor 178. The resulting illumination of indicator 23 correctly instructs player B to serve. The low level at output terminal 185 of flip-flop 181 causes the output of gate 166 to be high so that gate 166 is prevented at this time from energizing indicator 22. At the same time, the low level at one input terminal of gate 161 of network 115 as delivered by conductor 164 produces a low level at disable terminal 157 which causes controller 114 to relinquish control of the SERVE indicators 22 and 23 to controller 116.

If player A now scores the next point, he wins the game. If, however, player B scores the next point, his nineteenth point, the conditions at terminals 174 and 175 remain unchanged, i.e. terminal 174 remains low and terminal 175 remains high. The output terminals of gates 167 and 168 accordingly remain high and low respectively, and the output terminal of gate 168 thus holds one terminal of gate 171 low so that gate 171 is incapable of responding to the positive pulse 134 delivered by switch 111 to terminal 177 by line 192. The status of flip-flop 181 thus remains unchanged and indicator 23 remains energized by gate 165, correctly indicating the player B again has the serve at a score of 20 points for player A and 19 points for player B.

If player A gains the next point, the game is terminated. Assuming, however, that player B gains the next point to tie the game at twenty-to-twenty, terminals g2 and g4, respectively, of decoders 102 and 104 will both be at a low level at the instant the twentieth point of player B is registered, and hence terminals 174 and 175 of controller 116 will both be low and the output terminals of both gates 167 and 168 will be high when the positive pulse 134 from switch 111 arrives at terminal 177. The positive pulse 134 causes the output of gate 171 to go low, and the low output level applied at terminal 183 of flip-flop 181 changes the state of flip-flop 181 to produce a high level at flip-flop output terminal 185 and a low level at output terminal 184, which conditions cause terminals 178 and 179, respectively, to go high and low. As a consequence, indicator diode 22 will be energized indicating the serve is returned to player A and indicator diode 23 will be de-energized. From this point in the game onward, it will be found that as each player scores a point the SUCKER'S SERVE controller will give the serve to the other player until one player or the other gains a two-point advantage to win the game.

The first-serve transfer function accomplished by switch 121 may be accomplished alternatively by means of an independent momentary switch coupled to counter 152 of FIG. 12 or to counter 53 of FIG. 8 such that the actuation of the momentary switch causes the state of the counter 152 or 153 to be advanced by five counts. When this occurs, the signal level at output terminal A is switched from low (L) to high (H) or vice versa as may be understood through reference to FIG. 10, with the result that energization is transferred automatically from one to the other of the two serve indicator diodes, 22 and 23 of FIG. 12 or 79 and 80 of FIG. 8. Such a momentary transfer switch 204 is shown in FIG. 8 with one terminal connected to ground 62 and the other terminal connected to a clock terminal CL' of counter 53.

The stated objects of the invention are thus met in the various embodiments of the invention, as shown in FIGS. 1-12. Various combinations and features of the different embodiments may be eliminated or interchanged and different standard integrated circuit building blocks may be substituted for those here employed with appropriate changes in circuit interconnections. Furthermore, it will undoubtedly be found that a major part of the control circuit 50 or 100 may be incorporated in a single integrated circuit chip at a substantial reduction in cost. These and other changes and modifications apparent to those skilled in the art may be made therein without departing from the spirit of the invention or from the scope of the appended claims.

What is claimed is:

1. An electronic score-keeper for table-tennis comprising:
   first and second scoring switches,
   first and second sets of numerical display devices,
   first and second serve indicators,
   a sucker's serve indicator,
   an electronic control circuit comprising first and second electronic counters and a serve controller, reset means,
   means for coupling said serve controller to said first and said second scoring switches and to said first and second serve indicators,
   means for coupling said first electronic counter to said first scoring switch and to said first set of numerical display devices,
   means for coupling said second electronic counter to said second scoring switch and to said second set of numerical display devices,
   said first electronic counter being responsive to actuation of said first scoring switch and said second electronic counter being responsive to actuation of said second scoring switch,
   said serve controller responding to the actuation of either of said first and said second scoring switches by appropriately controlling the energization of said first and second serve indicators, and
   said reset means being coupled to said first and said second electronic counters and to said serve controller,
   whereby when said first or second scoring switch is actuated by the associated player each time a point is gained, the associated said sets of display devices register the running score of each player, said first and said second service indicators being alternately energized as appropriate to identify which of said players has the responsibility for the serve,
   at the conclusion of the game, when said reset means is actuated by one of the players said first and said second counters and said serve controller are reset to zero for the start of another game,
   wherein said serve controller comprises a five-point shift controller, and
   a twenty-point disable network,
   said five-point shift controller being coupled to said first and said second serve indicators and to said first and said second scoring switches,
   said twenty-point disable network being coupled to said first and said second electronic counters, to said five-point shift controller, and to said sucker's serve indicator,
   said five-point shift controller being responsive to said first and said second scoring switches until disabled by said twenty-point disable network,
   said twenty-point disable network being responsive to said first and said second electronic counters, and
   said sucker's service indicator being responsive to said twenty-point disable network,
   whereby said five-point shift controller selectively energizes one or the other of said first and said second serve indicators prior to the scoring of a total of twenty points by either of the opposing players and the twenty point disable network responds to the twentieth point scored by either of the players by causing said first and second serve indicators to be deenergized and said sucker's serve indicator to be energized for the remainder of the game.

2. The electronic score-keeper set forth in claim 1 in further combination with:
   a first-serve transfer switch coupled to said serve controller,
   said first-serve transfer switch being actuated manually by one of said players at the start of a game to effect the transfer of the first-serve indication from one of said first and second serve indicators to the other.

3. The electronic scorekeeper set forth in claim 1 wherein:
   each of said first and second electronic counters comprises a five-bit binary counter having a clock terminal, a reset terminal, and first, second, third, fourth and fifth output terminals, and
   each of said first and second sets of numerical display devices comprises first, second, third, fourth and fifth indicating elements,
   said first, second, third, fourth and fifth indicating elements of said first set of numerical display devices being coupled, respectively, to said first, second, third, fourth and fifth output terminals of said binary counter, and
   said first, second, third, fourth and fifth indicating elements of said second set of numerical display devices being coupled, respectively, to said first, second, third, fourth and fifth output terminals of said second binary counter,
   whereby said first, second, third, fourth and fifth indicating elements of each set of the numerical display devices are selectively energized to show point values of one, two, four, eight and sixteen, respectively, the sum of the point values of the selectively energized elements of each of said first and second sets of numerical display devices representing the score accumulated by a given player.

4. The electronic score-keeper of claim 3 wherein said five-point shift controller comprises:
   a counter means having a clock input terminal, an output terminal and a reset terminal, input coupling means for coupling said clock input terminal of said counter means to said first and second scoring switches, output coupling means for coupling said output terminal of said counter means to said first and second serve indicators and to said twenty-point disable network.

reset coupling means for coupling said reset terminal of said counter means to said reset means, whereby said input coupling means of said five-point shift controller responds to the operation of said first and second scoring switches by delivering a clock signal to said clock input terminal of said counter means each time either of said first and second scoring switches is operated, said counter means responding to said clock signals received at its said input clock terminal by producing at its said output terminal a change of state from a high state to a low state or from a low state to a high state each time the total number of said clock signals received reaches a multiple of five, said output coupling means being responsive to said twenty-point disable network and to said high and low states at said output terminal of said counter means such that:

when a disable signal is produced by said twenty-point disable network, said output coupling means of said five-point shift controller causes both of said serve indicators to be de-energized, and when said disable signal is not produced by said twenty-point disable network, said output coupling means of said five-point shift controller causes one of said serve indicators to be energized in the presence of said high state at said output terminal of said counter means and causes the other of said first and second serve indicators to be energized in the presence of said low state at said output terminal of said counter means, and said reset coupling means causes said counter means to be reset to a count of zero each time said reset means is operated.

5. The electronic scorekeeper of claim 4 wherein said twenty-point disable network comprises:

a disable flip-flop having first and second input terminals and an output terminal, disable input coupling means, said first input terminal of said disable flip-flop being coupled by said disable input coupling means to two of said output terminals of each of said first and second five-bit binary counters, said second input terminal of said disable flip-flop being coupled to said reset means, and said output terminal of said disable flip-flop being coupled to said five-point shift controller and to said sucker's serve indicator, whereby said input coupling means of said twenty-point disable network responds to a count of twenty accumulated by either of said first and second five-bit binary counters by delivering to said first input terminal of said disable flip-flop a set signal, said disable flip-flop being set by said set signal to a condition wherein said disable flip-flop delivers at its ouput terminal a disable signal, said disable signal causing said five-point shift controlled to de-energize both of said first and second serve indicators and causing said sucker's serve indicator to be energized until said disable flip-flop is reset by a reset signal coupled to said disable flip-flop reset terminal from said reset means.

6. The electronic scorekeeper of claim 4 wherein said twenty-point disable network comprises:

a disable flip-flop having a set terminal, a reset terminal and an output terminal, a first input gate having first and second input terminals and an output terminal, a second input gate having first and second input terminals and an output terminal, and a common pull-up resistor, said first and second input terminals of said first input gate being coupled, respectively, to said third and fifth output terminals of said first binary counter, said first and second input terminals of said second input gate being coupled, respectively, to said third and fifth output terminals of said second binary counter, said output terminals of said first and said second input gates being connected to said set terminal of said disable flip-flop and through said common pull-up resistor to a positive source of voltage, said output terminal of said disable flip-flop being connected to said disable terminal of said five-point shift controller, whereby a twenty-point count detected at said input terminals of either of said input gates causes said input gate to deliver a set signal at said set terminal of said disable flip-flop with the result that said output terminal of said disable flip-flop is set to a low state as appropriate for the disabling of said five-point shift controller and for the energizing of said sucker's serve indicator.

7. The electronic scorekeeper of claim 3 wherein said five-point shift controller comprises:

a bi-quinary counter having a clock input terminal, an output terminal and a reset terminal, an input gate having first and second input terminals and an output terminal, a first output gate having first and second input terminals and an output terminal, and a second output gate having first and second input terminals and an output terminal, said first and second input terminals of said input gate being coupled, respectively, to said first and second scoring switches, said output terminal of said input gate being connected to said clock terminal of said bi-quinary counter, said output terminal of said bi-quinary counter being connected to said first input terminal of said first output gate, said output terminal of said first output gate being connected to said first input terminal of said second output gate and to said first serve indicator, said output terminal of said second output gate being coupled to said second serve indicator, said second input terminals of said first and said second output gates being coupled to said twenty-point disable network, and said reset terminal of said bi-quinary counter being connected to said reset means, whereby said input gate responds to said first and second scoring switches, delivering a clock pulse to said clock terminal of said bi-quinary counter each time either of said scoring switches is actuated, the output voltage level at said output terminal of said bi-quinary counter changing state from low to high or from high to low at the end of each five successive clock pulses, said first output gate responding to said output voltage level from said bi-quinary counter and said second output gate responding to the resulting output voltage level of said first output gate such that the output levels of said first and second output gates are respectively high and low when said output voltage of said bi-quinary counter is low and are respectively low and high when said output voltage of said bi-quinary counter is high, the outputs of both said first and said second output gates being driven high when said second input terminals of said output gates are driven low by said twenty-point disable network.

8. The electronic scorekeeper of claim 1 wherein said serve controller comprises:

an electronic score-keeper for table-tennis comprising:

first and second scoring switches,
first and second sets of numerical display devices,
first and second serve indicators,
an electronic control circuit comprising first and second electronic counters and a serve controller,
reset means,
means for coupling said serve controller to said first and said second scoring switches and to said first and second serve indicators,
means for coupling said first electronic counter to said first scoring switch and to said first set of numerical display devices,
means for coupling said second electronic counter to said second scoring switch and to said second set of numerical display devices,
said first electronic counter being responsive to actuation of said first scoring switch and said second electronic counter being responsive to actuation of said second scoring switch,
said serve controller responding to the actuation of either of said first and said second scoring switches by appropriately controlling the energization of said first and second serve indicators, and
said reset means being coupled to said first and said second electronic counters and to said serve controller,
whereby when said first or second scoring switch is actuated by the associated player each time a point is gained, the associated said sets of display devices register the running score of each player, said first and said second serve indicators being alternately energized as appropriate to identify which of said players has the responsibility for the serve,
at the conclusion of the game, when said reset means is actuated by one of the players, said first and said second counters and said serve controller are reset to zero for the start of another game,
wherein said serve controller comprises:
a five point shift controller,
a twenty point disable network, and
a sucker's serve controller,
said five-point shift controller being coupled to said first and second scoring switches and to said first and second serve indicators,
said twenty point disable network being coupled to said first and second electronic counters and to said five point shift controller,
said sucker's serve controller being coupled to said first and second electronic counters, to said first and second scoring switches, and to said first and second serve indicators,
said five point shift controller being responsive to said first and second scoring switches and to said twenty point disable network,
said twenty point disable network being responsive to said first and second electronic counters,
said suckers's serve controller being responsive to said first and second electronic counters and to said first and second scoring switches,
said five point shift controller being in control of said first and second serve indicators prior to the attainment of a twenty point score by either of said players,
said twenty point disable network disabling said five point shift controller upon the attainment of twenty points by either of said players, and
said sucker's serve controller being in control of said first and second serve indicators following the attainment of a twenty point score by either of said players,
whereby said first and second serve indicators properly designate the serving responsibility throughout the course of the game in full accordance with the accepted rules of the game including those covering the sucker's serve period.

9. The electronic scorekeeper of claim 8 wherein:
said first numerical display device comprises a first and a second seven-segment digital display element,
said second numerical display device comprises a third and a fourth seven-segment digital display element,
said first electronic counter comprises a first and a second four-bit binary coded decimal counter,
said second electronic counter comprises a third and a fourth four-bit binary coded decimal counter,
said electronic control circuit including as coupling means between said seven-segment digital display elements and said decimal counters, first, second, third and fourth seven-segment decoder drivers each having first, second, third and fourth input terminals and first, second, third, fourth, fifth, sixth and seventh output terminals,
each of said seven-segment digital display elements having first, second, third, fourth, fifth, sixth and seventh input terminals,
each of said four-bit binary coded decimal counters having a clock terminal, a reset terminal, and first, second, third and fourth output terminals,
said first four-bit binary coded decimal counter having its said fourth output terminal connected to drive said clock terminal of said second four bit binary coded decimal counter,
said third four-bit binary coded decimal counter having its said fourth output terminal connected to said clock terminal of said fourth four-bit binary coded decimal counter,
said first, second, third and fourth seven segment digital display elements being coupled, respectively, to said first, second, third and fourth binary coded decimal counters by means of said first, second, third and fourth seven segment decoder drivers, each of said decoder drivers having its first, second, third and fourth input terminals connected, respectively, to said first, second, third and fourth output terminals of one of said decimal counters and having its said first, second, third, fourth, fifth, sixth and seventh output terminals connected respectively, to said first, second, third, fourth, fifth, sixth and seventh input terminal of one of said seven segment digital display devices, said reset terminals of said first, second, third and fourth decimal counters being connected to said reset means, said clock terminal of said first four-bit binary counter being coupled to said first scoring switch, and said clock terminal of said third four-bit counter being coupled to said second scoring switch, whereby said first and said second seven segment display elements display the score registered by one of said players and said third and said fourth seven segment display elements display the score registered by the other of said players.

10. The electronic scorekeeper of claim 8 in further combination with:

a first serve transfer switch coupled to said serve controller, said first serve transfer switch being actuated manually by one of said players at the start of the game to effect the transfer of the first serve indication from one of said first and second serve indicators to the other.

11. The electronic scorekeeper of claim 8 wherein said sucker's serve controller comprises:

first, second, third and fourth input terminals, first and second output terminals, and coupling means coupling said first and second output terminals to said first, second, third and fourth input terminals, said first and said third input terminals being coupled, respectively to said first and second electronic counters, said second and said fourth input terminals being coupled respectively, to said first and second scoring switches, and said first and second output terminal being coupled, respectively to said first and second serve indicators, whereby upon the actuation of said first or said second scoring switch for the registration of a twentieth point by either of said players, and upon the registration of each succeeding point thereafter by either of said players, said sucker's serve controller appropriately energizes one or the other of said first and second serve indicators to indicate which of said players has responsibility for the next serve.

12. The electronic scorekeeper of claim 8 wherein said sucker's serve controller comprises:

a sucker's serve flip-flop having first and second input terminals and first and second output terminals, first and second input gates, each having an output terminal and at least two input terminals, first and second output gates, each having an output terminal and at least two input terminals, said first input gate having its first and second input terminals coupled, respectively, to said first electronic counter and to said first scoring switch, and its output terminal coupled to said first input terminal of said sucker's serve flip-flop, said second input gate having its first and second input terminals coupled, respectively, to said second electronic counter and to said second scoring switch and its output terminal coupled to said second input terminal of said sucker's serve flip-flop, said first output gate having its first and second input terminals coupled, respectively, to said first electronic counter and to said first output terminal of said twenty-point disable flip-flop, and its output terminal coupled to said second serve indicator, said second output gate having its first and second input terminals coupled, respectively, to said second electronic counter and to said second scoring switch, and its output terminal coupled to said first scoring indicator, whereby upon the actuation of said first or said second scoring switch for the registration of a twenty-point score for either of said players, and upon the registration of each succeeding point thereafter by either of said players, said sucker's serve controller appropriately energizes one or the other of said first and second serve indicators to indicate which player has responsibility for the next serve.

* * * * *